(12) United States Patent
Imafuji et al.

(10) Patent No.: US 9,935,043 B1
(45) Date of Patent: Apr. 3, 2018

(54) INTERCONNECTION SUBSTRATE AND SEMICONDUCTOR PACKAGE

(71) Applicant: SHINKO ELECTRIC INDUSTRIES CO., LTD., Nagano (JP)

(72) Inventors: Kei Imafuji, Nagano (JP); Satoshi Fujii, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/718,414

(22) Filed: Sep. 28, 2017

(30) Foreign Application Priority Data

Oct. 5, 2016 (JP) .................................. 2016-197573

(51) Int. Cl.
| H01L 23/00 | (2006.01) |
| H01L 23/48 | (2006.01) |
| H01L 23/498 | (2006.01) |
| H01L 21/48 | (2006.01) |
| H01L 23/31 | (2006.01) |

(52) U.S. Cl.
CPC .... *H01L 23/49811* (2013.01); *H01L 21/4853* (2013.01); *H01L 23/3185* (2013.01); *H01L 24/16* (2013.01); *H01L 2224/16238* (2013.01); *H01L 2924/18161* (2013.01)

(58) Field of Classification Search
CPC .......... H01L 23/3185; H01L 23/49811; H01L 2924/18161; H01L 2924/01028; H01L 21/4853; H01L 2224/16145; H01L 2224/16238; H01L 2224/16237; H01L 2224/13164; H01L 2224/16258; H01L 2224/16147; H01L 2224/05647
See application file for complete search history.

(56) References Cited

U.S. PATENT DOCUMENTS

| 8,487,432 | B2 * | 7/2013 | Rinne .................... H01L 24/11 257/737 |
| 8,896,118 | B2 * | 11/2014 | Shahidi ............... H01L 21/4853 257/737 |
| 8,941,238 | B2 * | 1/2015 | Aoi .................... H01L 23/49811 257/738 |
| 9,799,621 | B2 * | 10/2017 | Lee ......................... H01L 24/13 |
| 2012/0091577 | A1 * | 4/2012 | Hwang ................... H01L 24/11 257/737 |
| 2015/0103494 | A1 * | 4/2015 | Kim ........................ H05K 3/24 361/728 |

FOREIGN PATENT DOCUMENTS

JP S62-134990 6/1987

* cited by examiner

*Primary Examiner* — Jasmine Clark
(74) *Attorney, Agent, or Firm* — IPUSA, PLLC (57) ABSTRACT

An interconnection substrate includes a first insulating layer, and an interconnection structure formed on the first insulating layer, wherein the interconnection structure includes an interconnection pattern having a first metal layer, a second metal layer formed on the first metal layer, and a third metal layer formed on the second metal layer, and a fourth metal layer covering an upper surface and side surface of the interconnection pattern, wherein an outer perimeter of the second metal layer protrudes at the side surface of the interconnection pattern to form a first protrusion, and the fourth metal layer has a second protrusion that protrudes at a side surface of the interconnection structure at a position corresponding to the first protrusion.

6 Claims, 9 Drawing Sheets

INTERCONNECTION SUBSTRATE AND SEMICONDUCTOR PACKAGE

CROSS-REFERENCE TO RELATED APPLICATIONS

The present application is based upon and claims the benefit of priority from the prior Japanese Patent Application No. 2016-197573 filed on Oct. 5, 2016, with the Japanese Patent Office, the entire contents of which are incorporated herein by reference.

FIELD

The disclosures herein relate to an interconnection substrate, a method of making the interconnection substrate, and a semiconductor package.

BACKGROUND

Use of an interconnection structure having copper or the like for external connection terminals such as pads may involve performing a surface treatment that covers the surface of the interconnection structure with a metal layer. There are various types of surface treatment, among which electroless nickel plating is mainly used due to its excellent solderability and wire-bonding strength.

In other cases than the use of an interconnection structure for external connection terminals (i.e., in the case of its use in an internal layer), surface treatment that covers a surface with a metal layer may also be used for the purpose of improving reliability through enhanced migration resistance. Electroless nickel plating may be used also in this case.

Electroless nickel plating performed on the surface of an interconnection structure creates a nickel plating film spreading at the bottom, which gives rise to a problem of short-circuiting between interconnections in places where the interconnection pitch is narrow. This is because, while electroless nickel plating requires a pretreatment process of enhancing catalyst activity through adsorption of palladium, this palladium is readily adsorbed on the surface of insulating resin between interconnections, resulting in deposition of an electroless nickel plating film on the surface of insulating resin.

To address this problem, technology has been developed that creates a nickel palladium alloy layer on the surface of insulating resin, followed by performing electroless nickel plating by using the nickel palladium alloy film as a catalyst layer. This technology allows the catalyst activity enhancement step to be omitted, thereby preventing the nickel plating film from having a spreading shape at the bottom (see Patent Document 1, for example).

Use of the above-noted technology to cover the surface of an interconnection structure with a metal layer such as a nickel plating film, however, causes the metal layer to have a flat surface. As a result, provision of insulating resin (e.g., an interlayer insulating layer, underfill resin, or the like) on the metal layer results in the lack of sufficient adhesion between the insulating resin and the interconnection structure.

[Related-Art Documents]
[Patent Document]
[Patent Document 1] Japanese Patent Application Publication No. 62-134990

SUMMARY

According to an aspect of the embodiment, an interconnection substrate includes a first insulating layer and an interconnection structure formed on the first insulating layer, wherein the interconnection structure includes an interconnection pattern having a first metal layer, a second metal layer formed on the first metal layer, and a third metal layer formed on the second metal layer, and a fourth metal layer covering an upper surface and side surface of the interconnection pattern, wherein an outer perimeter of the second metal layer protrudes at the side surface of the interconnection pattern to form a first protrusion, and the fourth metal layer has a second protrusion that protrudes at a side surface of the interconnection structure at a position corresponding to the first protrusion.

According to an aspect of the embodiment, a semiconductor package includes the interconnection substrate as described above, a semiconductor chip mounted on the interconnection substrate and electrically coupled to the interconnection structure, and insulating resin filling a gap between the interconnection substrate and the semiconductor chip and covering the interconnection structure.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

[Structure of Interconnection Substrate]

In the following, an interconnection structure will be described by using an example in which an interconnection structure is used as pads disposed on the surface layer of an interconnection substrate.

Figure 1A:
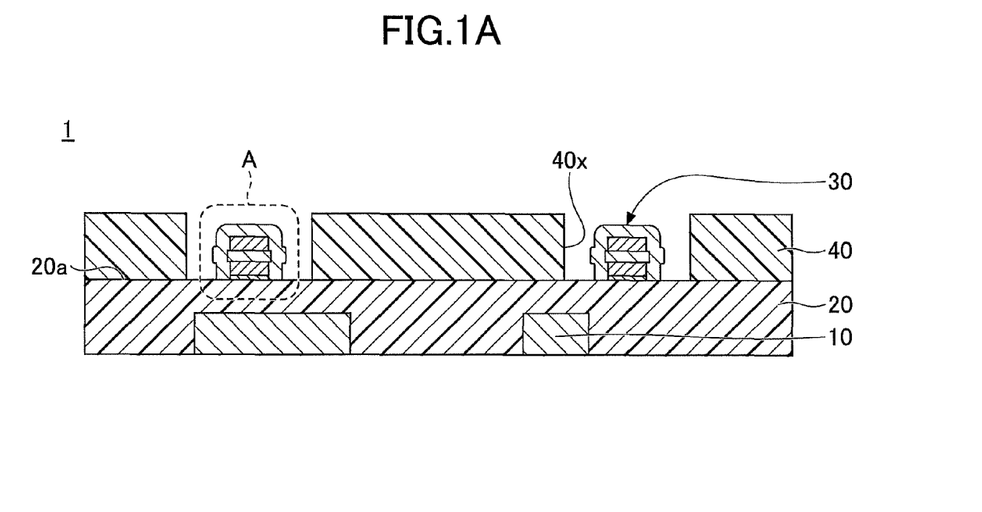
FIGS. 1A and 1B are cross-sectional views illustrating an example of an interconnection substrate according to an embodiment.
Figure 1B:
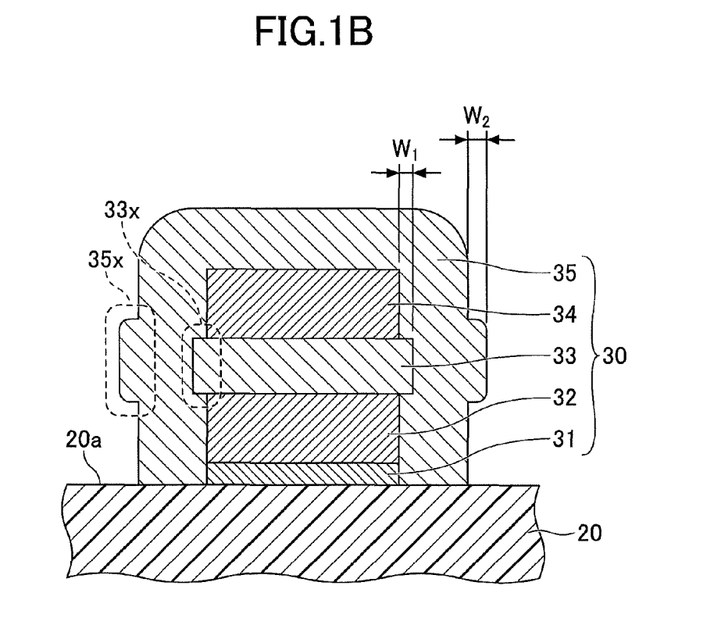

FIGS. 1A and 1B are cross-sectional views illustrating an example of an interconnection substrate according to the present embodiment. FIG. 1A illustrates the whole view, and FIG. 1B illustrates an enlarged view of an area A illustrated in FIG. 1A.

An interconnection substrate 1 illustrated in FIG. 1A is a coreless interconnection substrate which includes an interconnection layer 10, an insulating layer 20, at least one interconnection structure 30, and a solder resist layer 40. The interconnection structure disclosed herein may also be used in an interconnection substrate having a core.

In the present embodiment, for the sake of convenience, the side of the interconnection substrate 1 on which the solder resist layer 40 is situated is referred to as an upper side or a first side, and the side on which the insulating layer 20 is situated is referred to as a lower side or a second side. Further, the surface of a member situated toward the solder resist layer 40 side is referred to as an upper surface or a first surface, and the other surface of the member situated toward the insulating layer 20 side is referred to as a lower surface or a second surface. It may be noted, however, that the interconnection substrate 1 may be used in an upside-down position, or may be placed at any angle. Further, a plan view refers to a view taken in the direction perpendicular to an upper surface 20a of the insulating layer 20, and a plan view shape refers to the shape of an object as viewed in the direction perpendicular to the upper surface 20a of the insulating layer 20.

In the interconnection substrate 1, the interconnection layer 10 is embedded in the lower surface side of the insulating layer 20. The lower surface of the interconnection layer 10 is exposed through the lower surface of the insulating layer 20.

The upper surface and side faces of the interconnection layer 10 are covered with the insulating layer 20. The lower surface of the interconnection layer 10 may be flush with the lower surface of the insulating layer 20, for example.

The lower surface of each distinct part of the interconnection layer 10 exposed through the lower surface of the insulating layer 20 may have a circular plan-view shape, for example, which may be used as a pad for connection with another interconnection substrate or the like. The interconnection layer 10 may have an interconnection line pattern in addition to the one or more pads. Copper (Cu) may be used as the material of the interconnection layer 10. The interconnection layer 10 may alternatively have a multilayer structure comprised of a plurality of metal layers. The thickness of the interconnection layer 10 may be about 10 to 20 micrometers, for example.

The insulating layer 20 covers the upper surface and side faces of the interconnection layer 10. Non-photosensitive (thermosetting) epoxy insulating resin or polyimide insulating resin may be used as the material of the insulating layer 20. Alternatively, photosensitive epoxy insulating resin or acrylic insulating resin may be used as the material of the insulating layer 20. The insulating layer 20 may include filler such as silica ($SiO_2$). The thickness of the insulating layer 20 may be about 10 to 50 micrometers, for example. The insulating layer 20 may have via holes formed therethrough, through which the interconnection layer 10 and the interconnection structure 30 may be connected to each other.

The interconnection structure 30 is formed on the upper surface 20a of the insulating layer 20 that is a surface layer (i.e., a layer exposed on the surface). The interconnection structure 30 includes a metal layer 31, a metal layer 32, a metal layer 33, a metal layer 34, and a metal layer 35.

The metal layer 31 is directly disposed on the upper surface 20a of the insulating layer 20. The material of the metal layer 31 may be copper (Cu), titanium (Ti), chrome (Cr), an alloy of two or more of these metals, or a multi-layered film comprised of two or more layers of these metals. The thickness of the metal layer 31 may approximately be 0.01 to 1 micrometer, for example. The plan view shape of the metal layer 31 may be circular, for example.

The metal layer 32 is formed on the metal layer 31. The plan view shape of the metal layer 32 is substantially the same as the plan view shape of the metal layer 31. The metal layer 32 is formed to align with the metal layer 31 in a plan view. The material of the metal layer 32 may be a metal whose standard electrode potential is positive relative to the metal layer 35 and that is inactive against a reducing agent for electroless plating used to make the metal layer 35. The thickness of the metal layer 32 may be about 4 to 6 micrometers, for example.

The standard electrode potential, which is an electrode potential in an oxidation reduction reaction when the standard hydrogen electrode (NHE) is used as a reference, is −0.257 V for Ni and +0.342 V for Cu, for example.

The metal layer 33 is formed on the metal layer 32. The metal layer 34 is formed on the metal layer 33. The metal layer 34 is formed to align with the metal layers 31 and 32 in a plan view. The outer perimeter of the metal layer 33 protrudes outwardly relative to the side surface of the metal layer 32 and the side surface of the metal layer 34 to form a first protrusion 33x. In the case of the plan view shape of the metal layers 32 and 34 being circular, the first protrusion 33x protrudes outwardly in an annular shape outside the metal layers 32 and 34 in a plan view. The width $W_1$ of the first protrusion 33x may be 0.5 to 3 micrometers, for example.

The material of the metal layer 33 may be a metal that exhibits catalytic activity toward an electroless plating reducing agent used to make the metal layer 35. The thickness of the metal layer 33 may be about 1 to 3 micrometers, for example. The material of the metal layer 34 may be a metal whose standard electrode potential is positive relative to the metal layer 35 and that is inactive against a reducing agent for electroless plating used to make the metal layer 35. The thickness of the metal layer 34 may be about 4 to 6 micrometers, for example. The metal layer 34 and the metal layer 32 may be made of the same material, or may be made of respective, different materials.

The metal layer 35 is formed to cover the side surface of the metal layer 31, the side surface of the metal layer 32, the first protrusion 33x of the metal layer 33, and the upper surface and side surface of the metal layer 34. The metal layer 35 has a second protrusion 35x that protrudes on the side surface thereof at the position corresponding to the first protrusion 33x of the metal layer 33. In the case in which the plan view shape of the metal layer 35 except for the second protrusion 35x is circular, the second protrusion 35x protrudes outwardly in an annular shape outside such a circular shape in a plan view. The width $W_2$ of the second protrusion 35x may be 0.5 to 3 micrometers, for example. The thickness of the metal layer 35 (except for the portion where the second protrusion 35x is formed) may approximately be 1 to 10 micrometers, for example.

The material of the metal layer 35 may be an alloy having nickel (Ni) as a main component, for example. In such a case, cupper (Cu) may be used as the material of the metal layers 31, 32, and 34, for example. Further, the material of the metal layer 33 may be palladium (Pd) or nickel (Ni), for example.

The solder resist layer 40 is selectively formed on the upper surface 20a of the insulating layer 20. The material of the solder resist layer 40 may be insulating photosensitive resin containing phenolic resin, polyimide resin, or like as a main component, for example. The solder resist layer 40, which has photosensitive resin as a main component, may also include a filler material such as silica, alumina, or the like according to need. The thickness of the solder resist layer 40 may be about 5 to 30 micrometers, for example.

The solder resist layer 40 has at least one opening 40x. The interconnection structure 30 is exposed through the opening 40x (non-solder mask defined: NSMD). A surface treatment layer (not shown) may be formed on only the upper surface or the uppet surface and side surface of the interconnection structure 30 exposed through the opening 40x. Examples of the surface treatment layer may include an Au layer, a Pd/Au layer (which is a metal layer having a Pd layer and an Au layer laminated in this order), and the like. In place of forming of a metal layer, anti-oxidizing treatment such as OSP (i.e., organic solderability preservative) treatment or the like may be applied. The OSP treatment serves to form an organic film comprised of an azole compound, an imidazole compound, or the like as a surface treatment layer.

Figure 2:
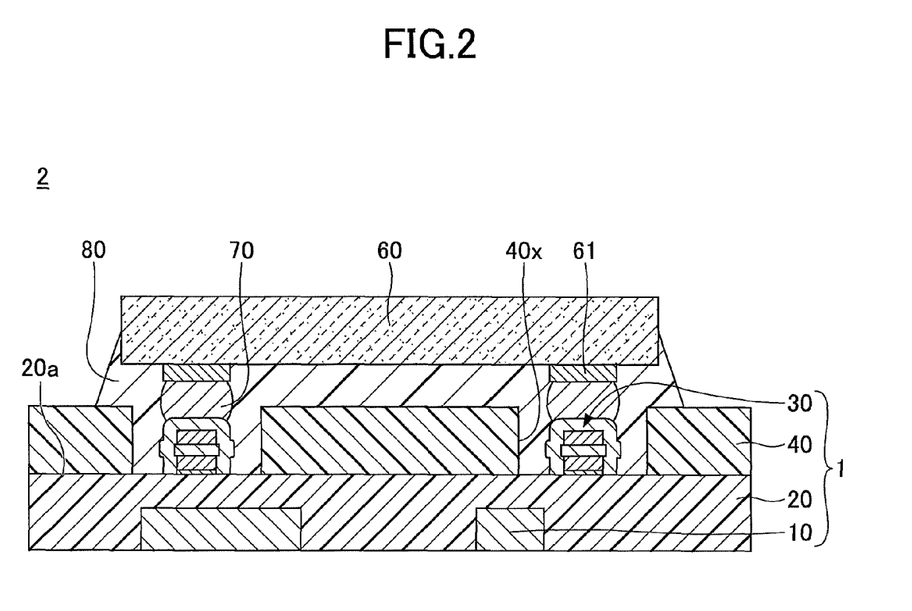
FIG. 2 is a cross-sectional view illustrating an example of a semiconductor package according to the embodiment.

As illustrated in FIG. 2, the interconnection substrate 1 may have a semiconductor chip 60 mounted (flip-chip mounted) thereon to form a semiconductor package 2, for example. The semiconductor chip 60 has at least one electrode pad 61 electrically coupled to the interconnection structure 30 of the interconnection substrate 1 through a bump 70 (e.g., solder bump). Underfill resin 80 fills a gap between the interconnection substrate 1 and the semiconductor chip 60 to serve as insulating resin covering the interconnection structure 30 and the bump 70.

As described above, the interconnection structure 30 exposed through the opening 40x in the interconnection substrate 1 serves to function as a pad that is electrically coupled to a semiconductor chip or the like. In the semiconductor package 2, the second protrusion 35x of the metal layer 35 provides an anchoring effect for the underfill resin 80, thereby improving the adhesion between the interconnection structure 30 and the underfill resin 80.

Improvement of the adhesion between the interconnection structure 30 and insulating resin as provided by the second protrusion 35x of the interconnection structure 30 is not limited to the semiconductor package structure as illustrated in FIG. 2, but may also be observed in the configuration in which the interconnection substrate is a standalone element.

In the interconnection substrate 1, the solder resist layer 40 may cover the upper surface perimeter and side surface of the interconnection structure 30 so as to expose the upper surface center of the interconnection structure 30 through the opening 40x (solder mask defined: SMD). In this case, the second protrusion 35x of the metal layer 35 provides an anchoring effect for the solder resist layer 40, thereby improving the adhesion between the interconnection structure 30 and the solder resist layer 40 serving as insulating resin.

Alternatively, the interconnection structure 30 may be formed as an inner layer rather than on the surface layer. For example, the interconnection layer 10 that is an inner layer in the interconnection substrate 1 may have the same structure as the interconnection structure 30. In this case, the insulating layer 20 covers the interconnection layer 10, and the second protrusion 35x of the metal layer 35 provides an anchoring effect for the insulating layer 20. Adhesion between the interconnection layer 10 and the insulating layer 20 serving as insulting resin is thus improved. It may be noted that use of the same structure as the interconnection structure 30 for the inner-layer interconnection layer 10 also provides an effect of increasing migration resistance so as to improve reliability.

[Method of Making Interconnection Substrate]

In the following, a description will be given of a method of making an interconnection substrate according to the present embodiment. FIGS. 3A to 3D through FIGS. 5A to 5C are drawings illustrating an example of the process of making an interconnection substrate according to the present embodiment. This embodiment is directed to the process steps of making a single interconnection substrate 1. Alternatively, however, a plurality of structures to serve as respective interconnection substrates may be made as a single piece, followed by being divided into respect interconnection substrates.

Figure 3A:
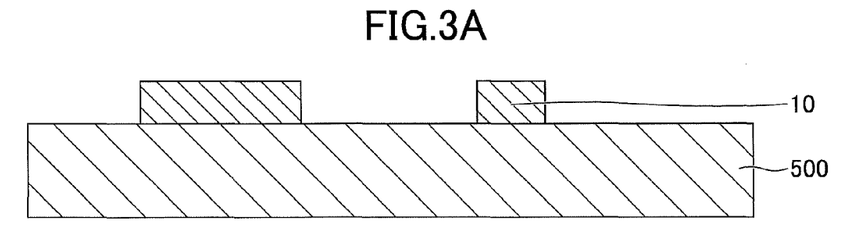
FIGS. 3A through 3D are drawings (part 1) illustrating an example of the process steps of making the interconnection substrate according to the embodiment.

In the process step illustrated in FIG. 3A, a support body 500 is put in place, and, then, the interconnection layer 10 is formed on the support body 500. The support body 500 may be a silicon plate, a glass plate, a metal foil plate, or the like. In this embodiment, the support body 500 is a copper foil. The thickness of the support body 500 may be about 35 to 100 μm, for example. The interconnection layer 10 may be formed by use of electrolytic plating that utilizes the support body 500 as a power feed layer, for example. Specifically, a resist layer having openings corresponding to the interconnection layer 10 is formed on the upper surface of the support body 500. Electrolytic plating utilizing the support body 500 as a plating power feed layer then forms the interconnection layer 10 made of copper or the like in the openings on the upper surface of the support body 500. Subsequently, the resist layer is removed.

Figure 3B:
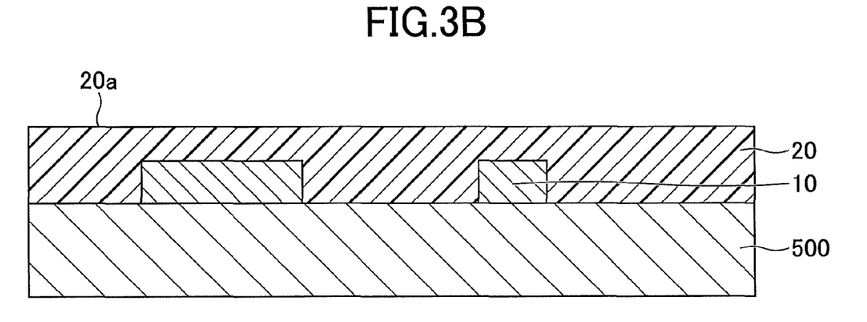

In the process step illustrated in FIG. 3B, the insulating layer 20 is formed on the upper surface of the support body 500 such as to cover the interconnection layer 10. Specifically, insulating epoxy resin or the like having a film shape is laminated onto the upper surface of the support body 500 such as to cover the interconnection layer 10, for example. Subsequently, the laminated insulating epoxy resin or the like is heated above the curing temperature to be cured under mechanical pressure. Instead of laminating the insulating epoxy resin or the like having a film shape, insulating epoxy resin or the like in a liquid form or paste form may be applied by use of a spin coating method or the like and then cured.

Figure 3C:
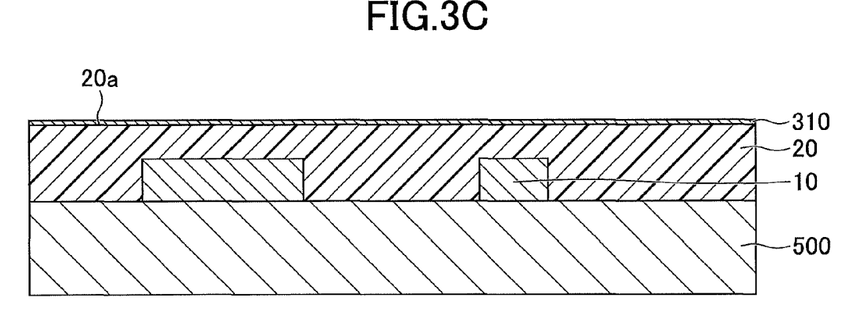

In the process steps illustrated in FIG. 3C through FIG. 4C, a semi-additive method is used to form part of the interconnection structure 30 (i.e., except for the metal layer 35). As illustrated in FIG. 3C, electroless plating or sputtering is used to form a metal layer 310 that covers the entirety of the upper surface 20a of the insulating layer 20. The thickness of the metal layer 310 may approximately be 0.01 to 1 micrometer, for example. The metal layer 310 is a copper layer, for example.

Figure 3D:
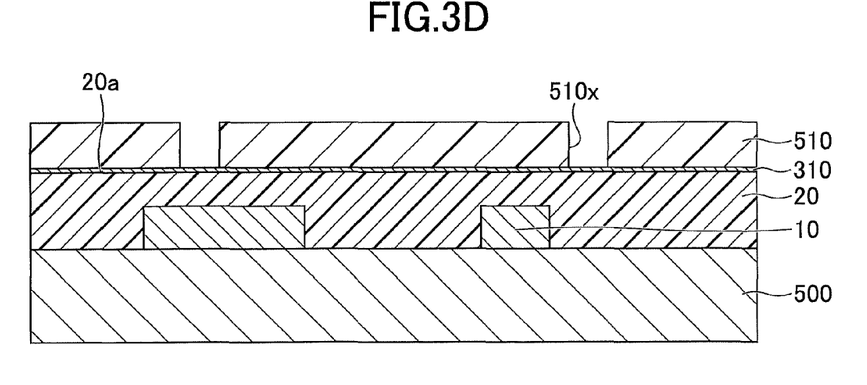

As illustrated in FIG. 3D, a photosensitive resist layer 510 (e.g., dry-film resist or the like) is formed on the metal layer 310. The resist layer 510 is then patterned through exposure and development, which forms the openings 510x selectively exposing the upper surface of the metal layer 310.

Figure 4A:
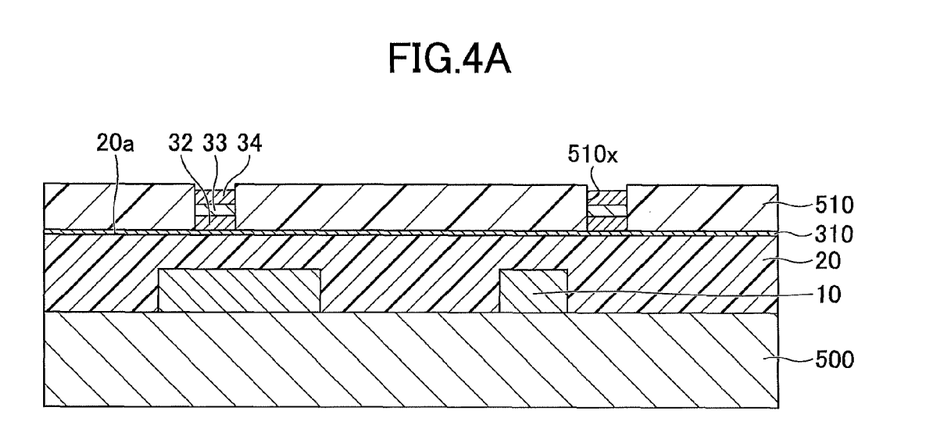
FIGS. 4A through 4C are drawings (part 2) illustrating an example of the process steps of making the interconnection substrate according to the embodiment.

As illustrated in FIG. 4A, electrolytic plating utilizing the metal layer 310 as a power feed layer forms the metal layers 32, 33, and 34 successively on the portions of the metal layer 310 exposed through the openings 510x of the resist layer 510, thereby selectively forming multilayer structures comprised of the metal layers 32, 33, and 34. The thickness of the metal layer 32 may be about 4 to 6 micrometers, for example. The thickness of the metal layer 33 may be about 1 to 3 micrometers, for example. The thickness of the metal layer 34 may be about 4 to 6 micrometers, for example.

As was previously described, the material of the metal layers 32 and 34 may be a metal whose standard electrode potential is positive relative to the metal layer 35 and that is inactive against a reducing agent for electroless plating used to make the metal layer 35. Further, the material of the metal layer 33 may be a metal that exhibits catalytic activity toward an electroless plating reducing agent used to make the metal layer 35. In the example used herein, the metal layer 35 is an alloy layer having nickel as a main component, and the metal layers 32 and 34 are copper layers, with the metal layer 33 being a palladium layer.

Figure 4B:
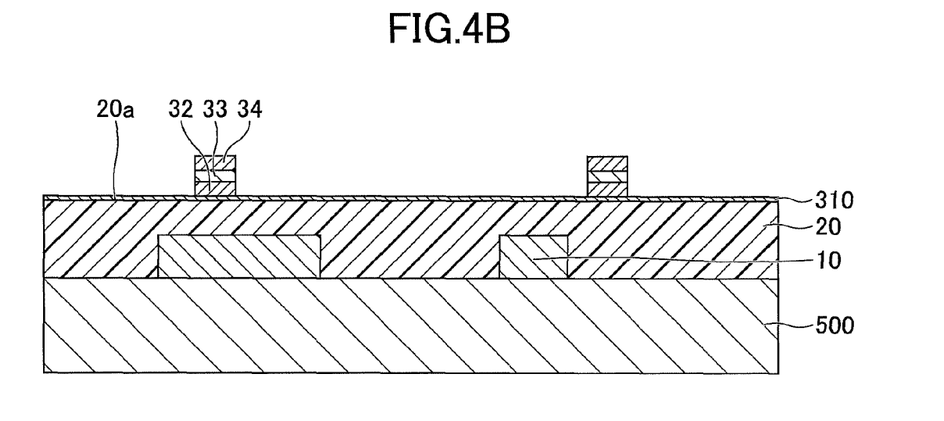

As illustrated in FIG. 4B, the resist layers 510 illustrated in FIG. 4A is removed. The resist layers 510 may be removed by use of a stripping solution containing sodium hydroxide or the like, for example.

Figure 4C:
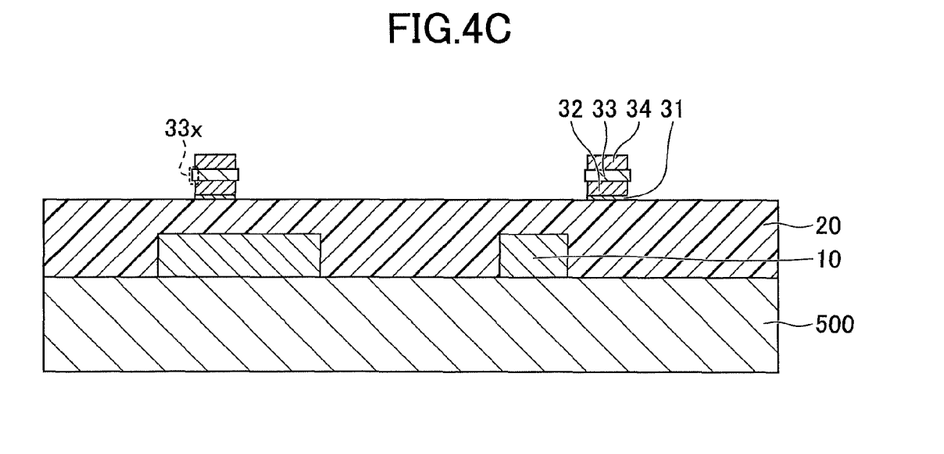

As illustrated in FIG. 4C, the multilayer structures comprised of the metal layers 32, 33, and 34 are used as masks to remove, by etching, the portions of the metal layer 310 that are not covered with the multilayer structures. As a result, the remaining portions of the metal layer 310 become the metal layer 31, with the metal layers 32, 33, and 34 laminated in this order on the metal layer 31. In the example described here, an etching solution that removes the copper metal layer 310 while being inactive against palladium is used. Examples of such etching solution include a hydrogen peroxide/sulfuric acid solution, a sodium persulfate solution, an ammonium persulfate solution, and the like.

In this process, the metal layers 32 and 34 are selectively etched while the metal layer 33 is not etched, which causes the outer perimeter of the metal layer 33 to protrude relative to the side surface of the metal layer 32 and the side surface of the metal layer 34 to form the first protrusion 33x. Namely, because the metal layers 32 and 34 are copper layers, these layers are etched together with the etching of the copper metal layer 310, but the metal layer 33 which is a palladium layer is not etched together. As a result, the outer perimeter of the metal layer 33 protrudes outwardly relative to the side surface of the metal layer 32 and the side surface of the metal layer 34 to form the first protrusion 33x. The metal layer 34 is formed such as to align with the metal layers 31 and 32 in a plan view. In the case of the plan view shape of the metal layers 32 and 34 being circular, the first protrusion 33x protrudes in an annular shape outside the circular shape of the metal layers 32 and 34 in a plan view. The width of the first protrusion 33x may be 0.5 to 3 micrometers, for example.

The metal layer 310 need not be limited to the same material as that of the metal layers 32 and 34, and may be copper (Cu), titanium (Ti), chrome (Cr), an alloy of two or more of these metals, or a multilayered film comprised of two or more layers of these metals, for example. In the case of the metal layer 310 being not a copper layer, the process step of etching and removing the portions of the metal layer 310 that are not covered by the multilayer structures of the metal layers 32, 33, and 34 may be performed separately from the process step of etching the metal layers 32 and 34 to form the first protrusion 33x at the outer perimeter of the metal layer 33.

Figure 5A:
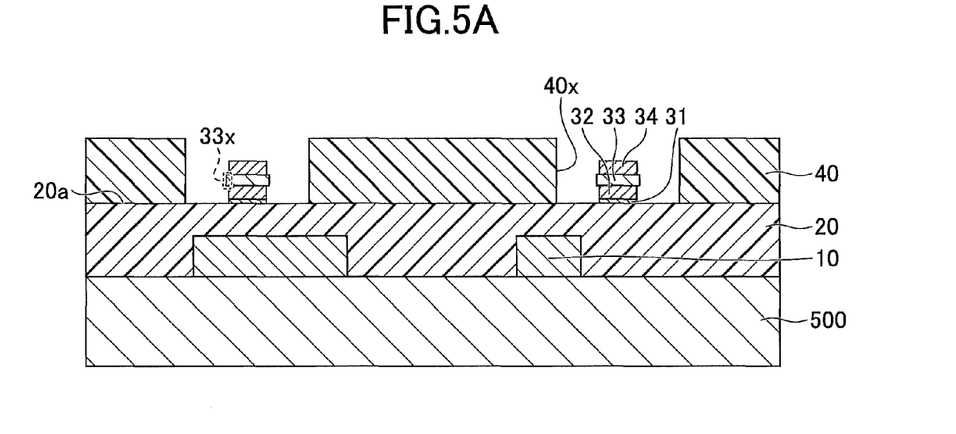
FIGS. 5A through 5C are drawings (part 3) illustrating an example of the process steps of making the interconnection substrate according to the embodiment.

As illustrated in FIG. 5A, the solder resist layer 40 is formed on the upper surface 20a of the insulating layer 20. The solder resist layer 40 may be initially formed by applying insulating resin in a liquid form or paste form all over the multilayer structures of the metal layers 31 through 34 by use of a screen printing method, a roll coating method, a spin coating method, or the like. Alternatively, an insulating resin film may be laminated all over the multilayer structures of the metal layers 31 through 34. The insulating resin used here may be a photosensitive insulating epoxy resin, a photosensitive insulating acrylic resin, or the like. The applied or laminated insulating resin is then subjected to exposure and development (i.e., photolithography) to form the openings 40x of the solder resist layer 40 which expose the upper surface and side surface of the multilayer structures each comprised of the metal layers 31 through 34 stacked one on another.

Figure 5B:
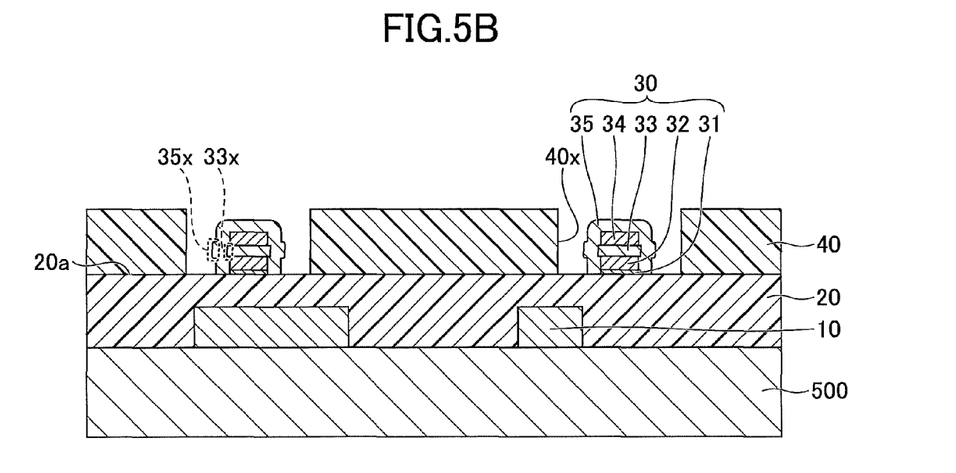

As illustrated in FIG. 5B, the metal layer 35 is formed to cover the side surface of the metal layer 31, the side surface of the metal layer 32, the first protrusion 33x of the metal layer 33, and the upper surface and side surface of the metal layer 34. The metal layer 35 is formed such as to have the second protrusion 35x protruding on the side surface thereof at the position corresponding to the first protrusion 33x. In this example, an alloy layer having nickel as a main component is formed as the metal layer 35 by electroless plating that does not involve a catalyst activity enhancement step as a pretreatment step. The plating solution may be of a nickel phosphorus type for which hypophosphite is used as a reducing agent, for example.

Figure 5C:
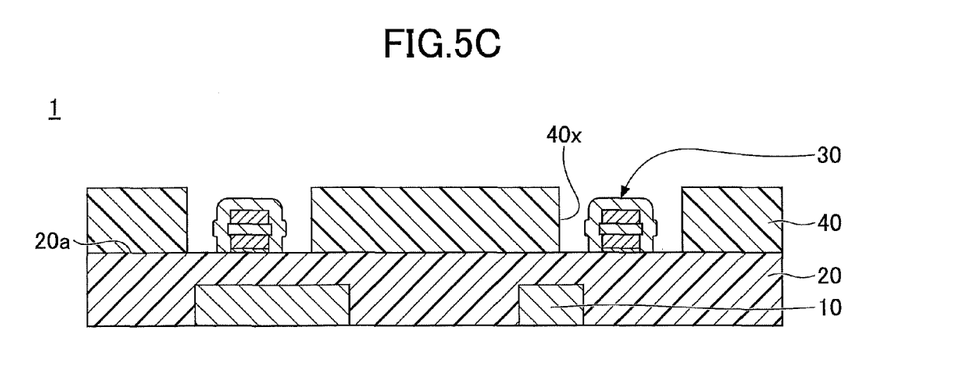

As illustrated in FIG. 5C, the support body 500 illustrated in FIG. 5B is removed to complete the final form of the interconnection substrate 1 illustrated in FIG. 1. The support body 500 made of a copper foil may be removed by wet etching using a ferric chloride solution, a copper chloride solution, an ammonium persulfate solution, or the like, for example. A metal layer that is not removable by the solution for etching copper may preferably be formed as the bottom layer of the interconnection layer 10 in the process step illustrated in FIG. 3A. With this arrangement, such a metal serves as an etch stop layer, thereby preventing the etching solution for removing the support body 500 from etching the interconnection layer 10.

It may be noted that the process step of forming the solder resist layer 40 illustrated in FIG. 5A may be performed after FIG. 5B or FIG. 5C, i.e., after the formation of the interconnection structure 30. In so doing, the solder resist layer 40 may be formed such as to cover the upper surface perimeter and side surface of the interconnection structure 30 while exposing the center of the upper surface of the interconnection structure 30 through the opening 40x.

In the process step illustrated in FIG. 5B, electroless plating (which uses a plating solution of a nickel phosphorus type for which hypophosphite is used as a reducing agent) that does not involve a catalyst activity enhancement step as a pretreatment step forms an alloy layer as the metal layer 35 having nickel as a main component. In the following, this mechanism will be described by referring to FIGS. 6A through 6E.

Figure 6A:
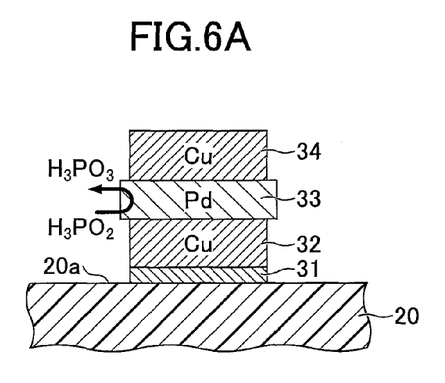
FIGS. 6A through 6E are drawings illustrating an electroless nickel plating method that does not involve a catalyst activity enhancement step as a pretreatment step.

As illustrated in FIG. 6A, hypophosphorous acid ($H_3PO_2$) starts to undergo a decomposition reaction (oxidative decomposition: $H_3PO_2$->$H_3PO_3$) on the surface of the first protrusion 33x of the metal layer 33 made of Pd because Pd exhibits a catalyst activity with respect to hypophosphite serving as a reducing agent. In contrast, a decomposition reaction of hypophosphorous acid does not occur on the surface of the metal layers 31, 32, and 34 made of Cu because such a surface exhibits almost no activity with respect to hypophosphite serving as a reducing agent.

Figure 6B:
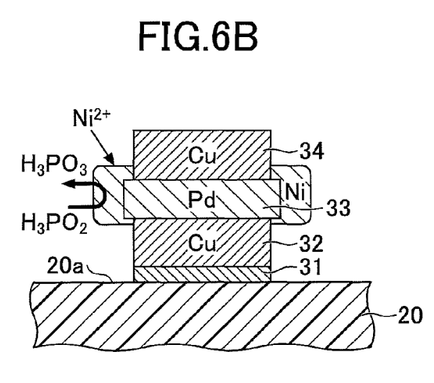

Subsequently, as illustrated in FIG. 6B, the decomposition reaction of hypophosphorous acid continues on the surface of the first protrusion 33x of the metal layer 33 made of Pd, resulting in the deposition of Ni. In contrast, no decomposition reaction of hypophosphorous acid occurs on the surface of the metal layers 31, 32, and 34 made of Cu, resulting in no deposition of Ni.

Figure 6C:
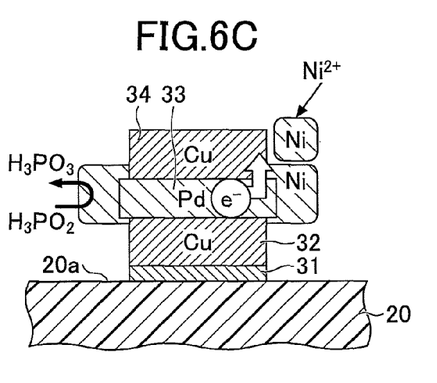

As illustrated in FIG. 6C, Ni also exhibits a catalyst activity with respect to hypophosphorous acid as does Pd, so that a decomposition process of hypophosphorous acid occurs on the surface of Ni. Since a local cell reaction is formed between Ni and Cu, electrons e⁻ generated by the decomposition reaction move to the surface of Cu. As Ni ions ($Ni^{2+}$) receive the electrons e-generated by the decomposition reaction, the reduction and deposition of Ni also occur on the surface of the metal layers 31, 32, and 34 made of Cu.

Figure 6D:
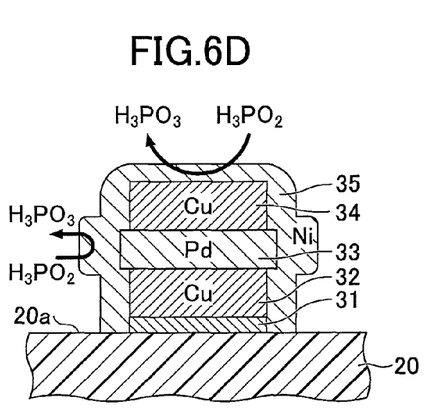

As illustrated in FIG. 6D, the reaction illustrated in FIG. 6C continues so as to produce Ni that covers all the surface of the metal layers 31, 32, and 34 made of Cu, which results in the disappearance of the local cell reaction.

Figure 6E:
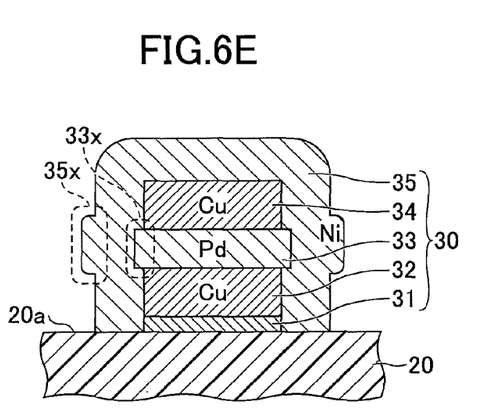

As illustrated in FIG. 6E, a decomposition reaction of hypophosphorous acid continues on the surface of Ni, resulting in further deposition of Ni to thicken the metal layer 35. The metal layer 35 has the second protrusion 35*x* formed thereon that protrudes on the side surface thereof at the position corresponding to the first protrusion 33*x* of the metal layer 33.

The above description has been provided with respect to the case in which the metal layer 33 is Pd. Alternatively, the metal layer 33 may be Ni, Zn, Fe, or the like. In such a case also, the same or similar structure as illustrated in FIG. 6E may be obtained through the same or similar mechanism as described above.

Figure 7A:
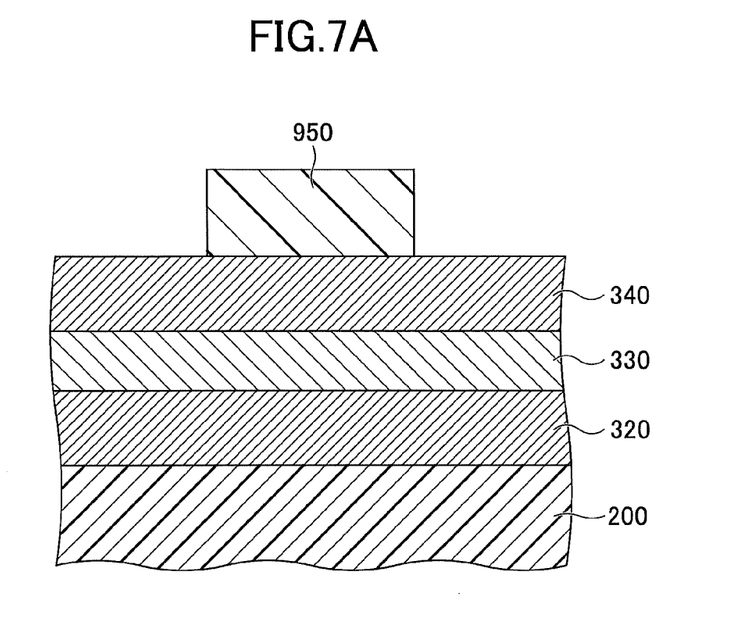
FIGS. 7A and 7B are drawings (part 1) illustrating a comparative example.
Figure 7B:
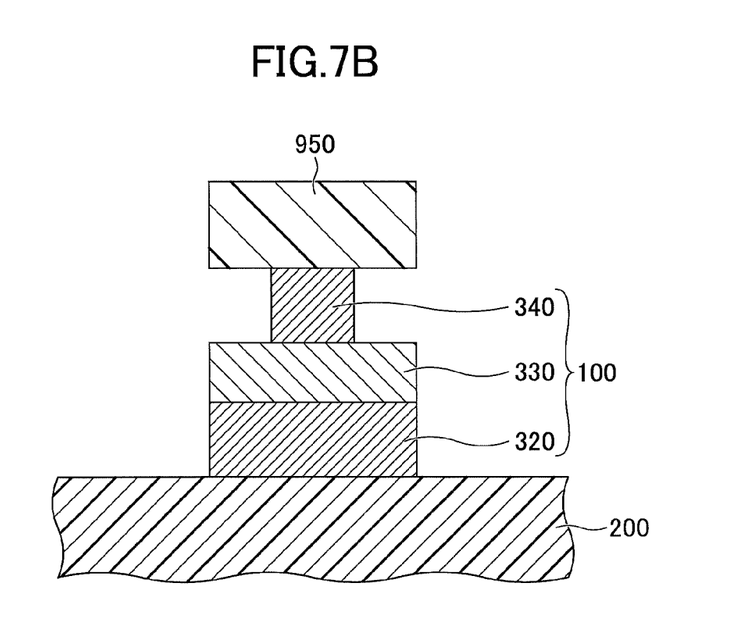

In the following, the advantages of the disclosed technology will be described by referring to a comparative example (FIGS. 7A and 7B through FIGS. 9A and 9B). FIGS. 7A and 7B are directed to an example in which a multilayer structure having a copper layer 320, a nickel-palladium alloy layer 330, and a copper layer 340 successively formed on an insulating layer 200 is subjected to the subtractive method to form a multilayer structure 100 as a first comparative example.

As illustrated in FIG. 7A, the multilayer structure having the copper layer 320, the nickel-palladium alloy layer 330, and the copper layer 340 formed one on another is etched by the subtractive method using a resist layer 950 as a mask. In this case, the copper layer 340 situated at the top of the multilayer structure is immersed in etching solution for a longer time period than is the copper layer 320 situated at the bottom, which means a greater etch amount on the side surface of the copper layer 340 than on the other surfaces. As a result, the horizontal width of the copper layer 340 becomes thinner than the other layers as illustrated in FIG. 7B. After FIG. 7B, the resist layer 950 is removed, and, then, electroless nickel plating is performed by using the nickel-palladium alloy layer 330 as a catalyst layer. This method is not suitable for miniaturization of interconnection structures because the width of the copper layer 340 turns out thinner than the other layers.

Figure 8A:
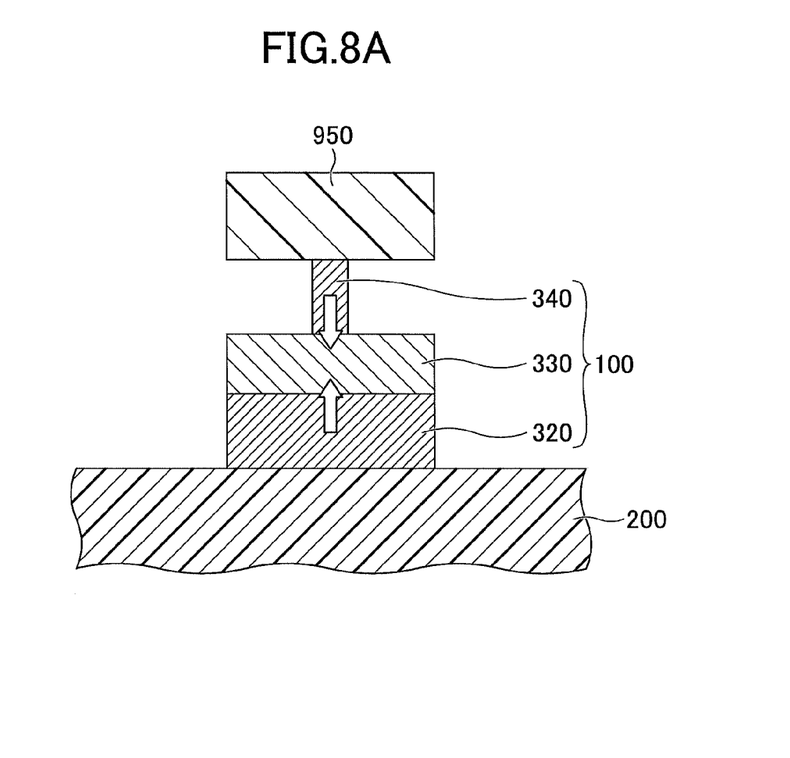
FIGS. 8A and 8B are drawings (part 2) illustrating a comparative example.
Figure 8B:
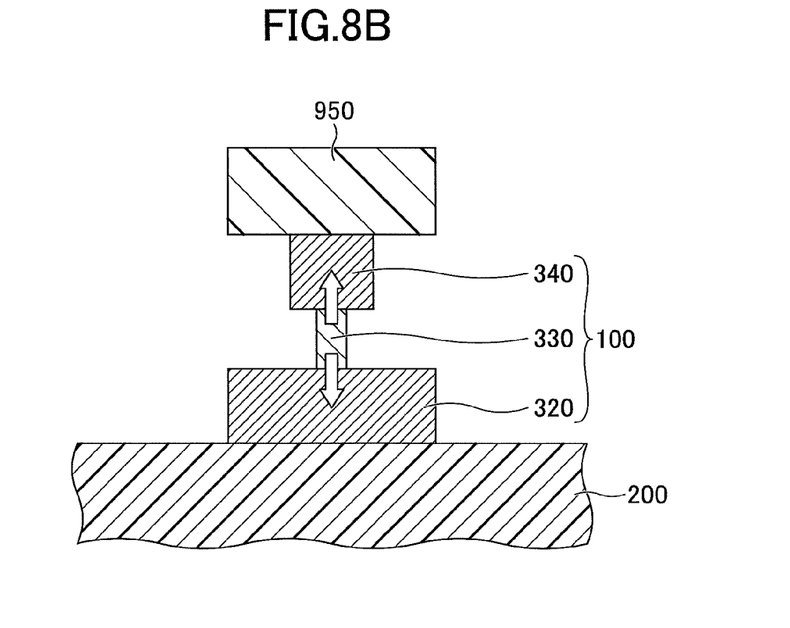

In the case of palladium being dominant at the time of etching illustrated in FIG. 7B, the copper layer 340 functions as a local anode to cause electrons to flow as shown by arrows in FIG. 8A, resulting in over-etching of the copper layer 340. In the case of nickel being dominant at the time of etching illustrated in FIG. 7B, nickel functions as a local anode to cause electrons to flow as shown by arrows in FIG. 8B, resulting in over-etching of the nickel-palladium alloy layer 330. A normal interconnection shape may not be retained in either case.

Even if some measures are taken to overcome the problems illustrated in FIGS. 7A and 7B and FIGS. 8A and 8B, the subtractive method has the function to etch the nickel-palladium alloy layer 330 in addition to the copper layers 320 and 340. As a result, the side surface of the multilayer structure 100 ends up being flat without a protrusion. Namely, the outer perimeter of the nickel-palladium alloy layer 330 does not protrude relative to the side surface of the copper layer 320 and the side surface of the copper layer 340. In this case, only the side surface of the nickel-palladium alloy layer 330 is exposed on the surface of the multilayer structure 100. The small area size of such an exposed surface does not provide a sufficient catalyst activity, resulting in a reduced reactivity that is unlikely to segregate a nickel plating film.

Figure 9A:
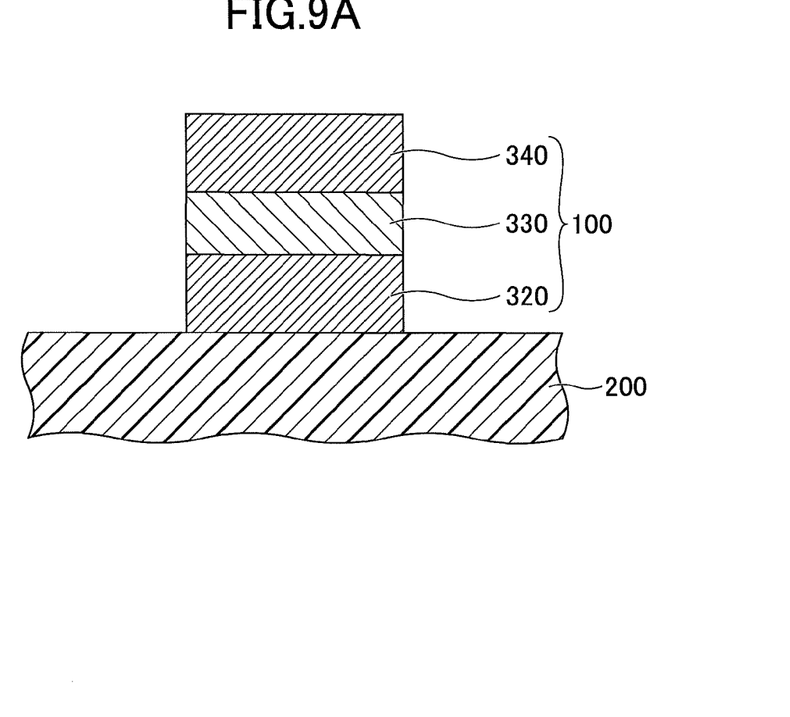
FIGS. 9A and 9B are drawings (part 3) illustrating a comparative example.
Figure 9B:
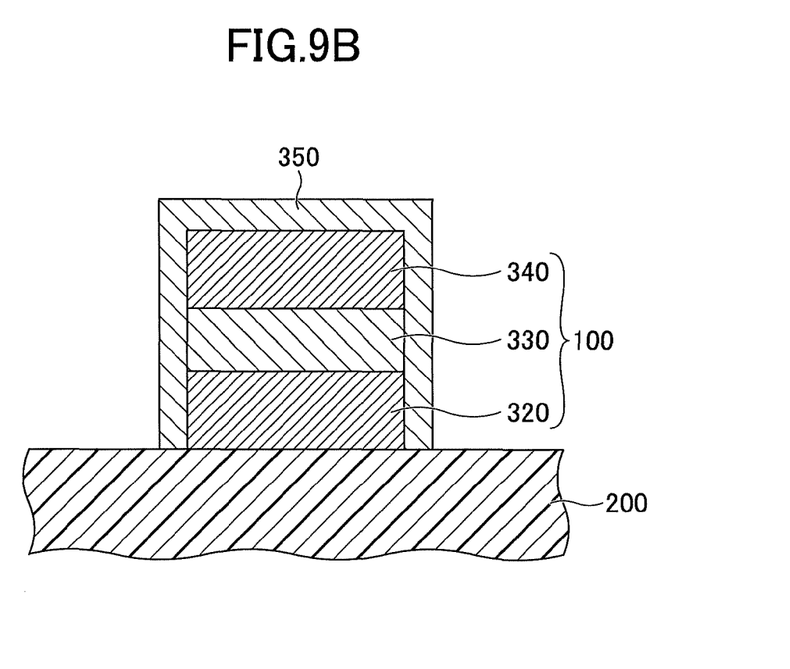

Even if a nickel plating layer 350 is segregated on the upper surface and side surface of the multilayer structure 100 as illustrated in FIG. 9B, the side surface of the nickel plating layer 350 would end up being flat, without having a portion corresponding to the second protrusion 35*x* illustrated in FIG. 1B. As a result, an anchoring effect does not come into being when insulating resin covers the multilayer structure 100 having the nickel plating layer 350 on the surface thereof, thereby failing to secure sufficient adhesion between the multilayer structure 100 and the insulating resin.

The structure and production method of the interconnection substrate 1, on the other hand, can obviate the problems described in connection with FIGS. 7A and 7B through FIGS. 9A and 9B.

Namely, electroless nickel plating is performed while the metal layer 34 has substantially the same horizontal width as that of the metal layer 32 in a plan view without becoming thinner. Further, the provision of the first protrusion 33*x* of the metal layer 33 serves to improve the reactivity of electroless nickel plating because of an increase in the area size of the catalyst layer exposed on the surface. Despite the absence of a catalyst placing process, thus, an electroless nickel plating film is deposited on all the surfaces (i.e., upper surface and side surface) of the multilayer structure comprised of the metal layers 31 through 34.

Moreover, the metal layer 35 has the second protrusion 35*x* formed thereon that protrudes on the side surface thereof at the position corresponding to the first protrusion 33*x* of the metal layer 33. As a result, when the interconnection structure 30 is covered with insulating resin, the second protrusion 35*x* of the metal layer 35 creates an anchoring effect with respect to the insulating resin, thereby improving adhesion between the interconnection structure 30 and the insulating resin.

Omitting a catalyst activity process serves to prevent the nickel plating film constituting the metal layer 35 from having a spreading shape at the bottom, which enables the narrowing of pitches of the interconnection structures 30.

According to at least one embodiment, adhesion between a metal layer and insulating resin is improved in an interconnection substrate having an interconnection structure in which the metal layer covers the surface of an interconnection.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

The present disclosures non-exhaustively include the subject matter set out in the following clauses:

Clause 1. A method of making an interconnection substrate, comprising:

forming on an insulating layer an interconnection pattern having a first metal layer, a second metal layer, and a third metal layer disposed one on another;

selectively etching the first metal layer and the third metal layer relative to the second metal layer to form a first protrusion that is an outer perimeter of the second metal layer protruding at a side surface of the interconnection pattern; and forming a fourth metal layer covering a side surface of the first metal layer, the first protrusion, and an upper surface and a side surface of the third metal layer, wherein the forming of the fourth metal layer results in a second protrusion being formed to protrude at a side surface of the fourth metal layer at a position corresponding to the first protrusion.

Clause 2. The method as recited in clause 1, wherein the first metal layer and the third metal layer are made of a metal whose standard electrode potential is positive relative to nickel and that is inactive against a reducing agent for electroless nickel plating, wherein the second metal layer is made of a metal that exhibits a catalytic activity toward the reducing agent for electroless nickel plating, and wherein the forming of the fourth metal layer utilizes electroless nickel plating to deposit an alloy containing nickel as a main component on the side surface of the first metal layer and the upper surface and side surface of the third metal layer after plating an alloy containing nickel as a main component on the first protrusion, thereby forming the fourth metal layer.

Clause 3. The method as recited in clause 2, wherein a plating solution used in the electroless nickel plating is of a nickel phosphorus type for which hypophosphite is used as a reducing agent.

Clause 4. The method as recited in clause 1, further comprising forming a fifth metal layer on the insulating layer before the forming of the interconnection pattern, wherein the forming of the interconnection pattern forms the interconnection pattern on the fifth metal layer, wherein the forming of the first protrusion removes that portion of the fifth metal layer which is not covered with the interconnection layer, in addition to selectively etching the first metal layer and the third metal layer, and wherein the forming of the fourth metal layer forms the fourth metal layer covering a side surface of the fifth metal layer, the side surface of the first metal layer, the first protrusion, and the upper surface and side surface of the third metal layer.

What is claimed is:

1. An interconnection substrate, comprising:
   a first insulating layer; and
   an interconnection structure formed on the first insulating layer,
   wherein the interconnection structure includes:
   an interconnection pattern having a first metal layer, a second metal layer formed on the first metal layer, and a third metal layer formed on the second metal layer; and
   a fourth metal layer covering an upper surface and side surface of the interconnection pattern,
   wherein an outer perimeter of the second metal layer protrudes at the side surface of the interconnection pattern to form a first protrusion, and
   the fourth metal layer has a second protrusion that protrudes at a side surface of the interconnection structure at a position corresponding to the first protrusion.

2. The interconnection substrate as claimed in claim 1, wherein the fourth metal layer is made of an alloy containing nickel as a main component, and the first metal layer and the third metal layer are made of a metal whose standard electrode potential is positive relative to nickel and that is inactive against a reducing agent for electroless nickel plating, and
   wherein the second metal layer is made of a metal that exhibits a catalytic activity toward the reducing agent for electroless nickel plating.

3. The interconnection substrate as claimed in claim 2, wherein the first metal layer and the third metal layer are made of copper, and the second metal layer is made of palladium or nickel.

4. The interconnection substrate as claimed in claim 1, further comprising a fifth metal layer between an upper surface of the first insulating layer and a lower surface of the first metal layer, a side surface of the fifth metal layer being covered with the fourth metal layer.

5. The interconnection substrate as claimed in claim 1, further comprising a second insulating layer formed on the first insulating layer to cover the interconnection structure.

6. A semiconductor package, comprising:
   the interconnection substrate of claim 1;
   a semiconductor chip mounted on the interconnection substrate and electrically coupled to the interconnection structure; and
   insulating resin filling a gap between the interconnection substrate and the semiconductor chip and covering the interconnection structure.

* * * * *